United States Patent [19]

Esser et al.

[11] Patent Number: 4,716,446
[45] Date of Patent: Dec. 29, 1987

[54] INSULATED DUAL GATE FIELD EFFECT TRANSISTOR

[75] Inventors: Leonard J. M. Esser; Petrus J. A. M. Van de Wiel; Leonardus A. Daverveld; Johannes A. A. Van Gils, all of Eindhoven, Netherlands

[73] Assignee: U.S. Philips Corporation, New York, N.Y.

[21] Appl. No.: 872,630

[22] Filed: Jun. 9, 1986

Related U.S. Application Data

[63] Continuation of Ser. No. 558,229, Dec. 5, 1983, abandoned.

[30] Foreign Application Priority Data

Dec. 16, 1982 [NL] Netherlands ............... 8204855

[51] Int. Cl.[4] ............................................ H01L 29/78
[52] U.S. Cl. .................................. 357/23.14; 357/23.4; 357/41
[58] Field of Search ................. 357/23.14, 23.4, 23.3, 357/41, 59

[56] References Cited

U.S. PATENT DOCUMENTS

| 3,450,960 | 6/1969 | Chang | 357/23.14 |
| 3,926,694 | 12/1975 | Cauge | 357/41 |
| 4,189,737 | 2/1980 | Schrader | 357/23.3 |
| 4,306,352 | 12/1981 | Schrader | 357/23.14 |

FOREIGN PATENT DOCUMENTS

| 0158597 | 1/1983 | German Democratic Rep. | 357/23.14 |
| 54-18687 | 2/1979 | Japan | 357/23.14 |
| 2089118 | 6/1982 | United Kingdom | 357/23.14 |

OTHER PUBLICATIONS

The Electronic Engineer, Sep. 1967, pp. 36-39, by Dawson.
IBM Technical Disclosure Bulletin, vol. 19, #7, Dec. 1976, p. 2787.
IBM Tech. Disc. Bulletin, vol. 21, #8, Jan. 1979, p. 3368, by Larson et al.

Primary Examiner—Andrew J. James
Assistant Examiner—Mark Prenty
Attorney, Agent, or Firm—Robert T. Mayer; Steven R. Biren

[57] ABSTRACT

A semiconductor device comprising a field effect transistor of the lateral or vertical DMOST type having a source zone of the one conductivity type, an adjoining channel region of the other conductivity type, a drain zone of the one conductivity type and a weakly doped drift region located between the drain zone and the channel region. According to the invention a second gate electrode located on the side of the drain zone and separated from the first gate electrode is disposed on the insulating layer above the channel zone behind the first gate electrode located on the side of the source zone. The length $L_2$ of the part of the second gate electrode located above the channel zone is at least equal to that of the part of the first gate electrode located above the channel zone. As a result, a high value of the mutual conductance $g_m$ as well as good linearity can be obtained. The second gate electrode is preferably made of polycrystalline silicon, which in the operating condition is depleted at least in part above the drift region.

8 Claims, 11 Drawing Figures

INSULATED DUAL GATE FIELD EFFECT TRANSISTOR

This is a continuation of application Ser. No. 558,229, filed Dec. 5, 1983, now abandoned.

BACKGROUND OF THE INVENTION

The invention relates to a semiconductor device having a semiconductor body comprising at least an insulated gate field effect transistor having a surface-adjacent first region of a given conductivity type, a surface-adjacent channel region of a first conductivity type surrounded at least laterally by the first region, a source zone of the second opposite conductivity type adjoining the surface and surrounded within the semiconductor body at least in part by the channel region, a surface-adjacent channel zone between the source zone and the first region and forming part of the channel region, a drain zone of the second conductivity type which is separated by a part of the first region—the drift region—from the channel region and has a higher doping concentration than the first region, an electrically insulating layer located at least on the channel zone and a gate electrode located on the insulating layer above the channel zone.

The invention further relates to a method of manufacturing the device.

A semiconductor device of the kind described above is known from U.S. Pat. No. 3,926,694.

With the use of insulated gate field effect transistors, which are often briefly designated as MOS transistors, the mutual conductance or transconductance $$g_m = \left(\frac{\delta I_D}{\delta V_g}\right) V_{DS},$$

where $I_D$ is the drain current, $V_g$ is the gate voltage and $V_{DS}$ is the voltage between the source zone and the drain zone, is of major importance.

For such field effect transistors, it is desirable in many cases that they can be used at high to very high frequencies, and moreover that even with small currents they have a high mutual conductance $g_m$ and a good linearity, that is to say a minimum variation of $g_m$ with varying $V_g$.

It is known that a conventional high-frequency insulated gate field effect transistor has not only a better high-frequency behavior, but also a higher mutual conductance and a better linearity as the channel is made shorter. In order to obtain the high value of $g_m$ desired for many applications, a channel length of at most 1 μm is necessary.

Such very short channel lengths can be attained in practice most easily with insulated gate field effect transistors of the so-called DMOST type. In this case, the doping of the source zone and that of the channel region take place through the same window. The lateral dimension of the channel region is then determined by the difference in lateral diffusion of the source zone and of the channel region. Such a field effect transistor has been described in the aforementioned U.S. Pat. No. 3,926,694.

In DMOS transistors, however, a complication occurs due to the fact that the $g_m$-$V_g$ characteristic is determined not only by the formulation of a "short" channel in the narrow diffused channel region controlled by the signal, but also by the formation—under the influence of the gate electrode—behind this region of a controlled "long" channel in the "drift region" located between the channel region and the drain zone. As a result, at a given value $V_{go}$ of the gate voltage, a local maximum value $g_{mo}$ of the mutual conductance occurs; with a further increase of the gate voltage, the mutual conductance decreases again, after which it gradually increases again. This is connected with the fact that with control voltages above $V_{go}$, the current is determined not only by the "short" channel, but also by the "long" channel due to the fact that the "short" channel passes from the pinched-off state to the non-pinched-off state. Consequently, an irregularity occurs in the form of a peak in the $g_m$-$V_g$ characteristic and the mutual conductance $g_m$ remains considerably lower than with a conventional MOS transistor having the same gate electrode structure and a channel length corresponding to the "short" channel of the DMOST.

By varying the ratio of the lengths of the short and the long channel, the height of the said peak and the gate voltage at which it occurs can be varied. It has been found that with an unchanged overall length of the short and the long channel, the height of the peak decreases and consequently the linearity for gate voltages larger than $V_{go}$ is improved as the lengths of the short and of the long channel approach each other. This linearity, which is even better than with a conventional MOS transistor having a comparable short channel, only occurs, however, at a comparatively high value of the gate voltage $V_g$ and for a comparatively low value of the mutual conductance $g_m$.

SUMMARY OF THE INVENTION

The invention has inter alia for its object to provide a field effect transistor of the DMOST type, in which with a comparatively low gate voltage $V_g$ a very good linearity can be obtained at a high value of the mutual conductance $g_m$.

According to the invention, a semiconductor device of the kind described above is characterized in that a second gate electrode located on the side of the drain zone and separated from the first gate electrode is present on the insulating layer above the channel zone behind the first gate electrode located on the side of the source zone, whereby, in the direction from the source zone to the drain zone, the length ($L_2$) of the part of the second gate electrode located above the channel zone is at least equal to that ($L_1$) of the part of the first gate electrode located above the channel zone.

The invention is based inter alia on the recognition of the fact that the aforementioned irregularity in the $g_m$-$V_g$ characteristic of a DMOST can be advantageously utilized for attaining the desired $g_m$-$V_g$ characteristic of high linearity at a high value of $g_m$ and a comparatively low gate voltage $V_g$ in that the said consecutively arranged channels controlled by the signal are both made very short and preferably so short that they both extend practically only in the diffused channel region and not outside it in the drift region. According to the invention, this is achieved in that, viewed from the source zone to the drain zone, two mutually separated gate electrodes are consecutively arranged above the short diffused channel region.

Due to the very small relative distance of the two gate electrodes provided on the narrow channel region, a signal voltage which is applied to the first gate electrode located beside the source zone is also capacitively coupled to the second gate electrode located on the side of the drain zone. Both channels in the diffused channel region are consequently controlled by the signal. When different direct (bias) voltages are applied to the two gate electrodes, the $g_m$-$V_g$ characteristic can be varied within given limits and a characteristic can be obtained with which at a comparatively low gate voltage a comparatively high mutual conductance and very good linearity are obtained.

Preferably, measures are therefore taken such that in the drift region between the drain zone and the diffused channel region the current is substantially not influenced by the second gate electrode located above this region. This is advantageously obtained when a silicon layer is used as the second gate electrode, which in the operating condition is not depleted above the channel region and is depleted at least in part above the drift region under the influence of the prevailing voltages. For this purpose, this silicon layer preferably has such a doping concentration (in atoms per cm$^3$) and such a thickness (in cm) that the product thereof lies between about $0.5 \cdot 10^{12}$ and $1.5 \cdot 10^{12}$ atoms per cm$^2$.

The ratio between the lengths $L_1$ of the "short" channel and the length $L_2$ of the "long" channel is advantageously chosen so that $1 \leq L_2/L_1 \leq 4$. Within this range, the optimum $g_m$-$V_g$ characteristics for the various applications are obtained. According to a further preferred embodiment, $1 \leq L_2/L_1 \leq 1.5$.

The invention also relates to a method by means of which the semiconductor device can be manufactured technologically in a comparatively simple manner. This method is characterized in that a semiconductor substrate of a first conductivity type is provided on one side with a layer of the second opposite conductivity type, in that on the surface of this layer an oxide layer and on this layer an anti-oxidation layer is formed, in that on the anti-oxidation layer a first silicon layer is deposited and is shaped into the form of a gate electrode, in that then this gate electrode is oxidized and a photolacquer mask partly overlapping the gate electrode is provided at the area of the drain zone to be formed, in that a zone of the first conductivity type is formed by ion implantation under the uncovered parts of the oxide layer and the anti-oxidation layer, in that the photolacquer mask is removed and the zone of the first conductivity type is diffused into the substrate and as far as under the gate electrode by heating in order to form the channel region, after which source and drain zones of the second conductivity type are formed by ion implantation with the use of the oxidized gate electrode as a mask, in that the oxide layer is removed from the gate electrode, in that the gate electrode is again lightly oxidized, in that then the uncovered parts of the anti-oxidation layer are etched away and in that subsequently a further conducting gate electrode is formed above the channel region so as to be located beside and to partly overlap the oxidized gate electrode already provided.

BRIEF DESCRIPTION OF THE DRAWING

The invention will now be described more fully with reference to the drawing, in which.

The Figures are purely schematic and are not drawn to scale. This applies especially for the dimensions in the direction of thickness.

DESCRIPTION OF THE PREFERRED EMBODIMENTS

Figure 1:
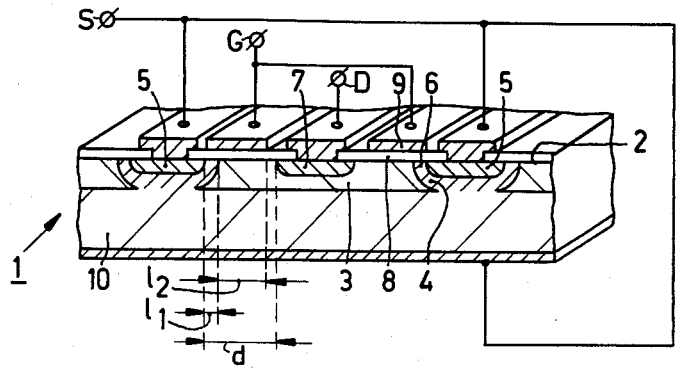
FIG. 1 shows, partly in perspective view and partly diagrammatically in cross-section, a DMOS transistor having a conventional structure.

FIG. 1 shows, partly in cross-section and partly in perspective view, a semiconductor device comprising a known insulated gate field effect transistor of the DMOS type. The transistor comprises a semiconductor body 1, in this example of silicon, having a first region 3 of a given conductivity type adjoining the surface 2, in this example an n-type layer which adjoins a p-type substrate 10. The device further comprises a channel region 4 of a first conductivity type, in this case the p-type, which adjoins the surface 2 and which is laterally surrounded by the first region 3 and joins the substrate 10. A source zone 5 of the second opposite (so here the n) conductivity type is surrounded within the semiconductor body at least in part, and in this example entirely, by the channel region 4. Between the source zone 5 and the first region 3 there is located the channel zone 6 forming part of the channel region 4 and adjoining the surface 2. A drain zone 7 of the second (here the n) conductivity type is separated by a part of the first region 3, also designated as the drift region, from the channel region 4 and has a higher doping concentration than the first region 3. Further, an electrically insulating layer 8 is present on the channel zone 6 and also at other areas on the surface 2, while a gate electrode 9 is disposed on this insulating layer above the channel zone 6. The source and drain zones 5 and 7 are connected to source and drain electrode connections S and D, repectively, while the gate electrode 9 is connected to the gate electrode connection G. A field effect transistor of the kind described thus far is known from U.S. Pat. No. 3,926,694.

In this field effect transistor, at a sufficiently high gate voltage $V_g$, two channels controlled by the gate electrode 9 can be formed. The first "short" channel has a maximum length $l_1$ and is located within the channel region 4 in the channel zone 6. The second "long" channel has a maximum length $l_2$ and is located in the drift region 3 under the gate electrode 9. As a result, an irregularity occurs in the $g_m$-$V_g$ characteristic, as will be described with reference to FIG. 2.

Figure 2:
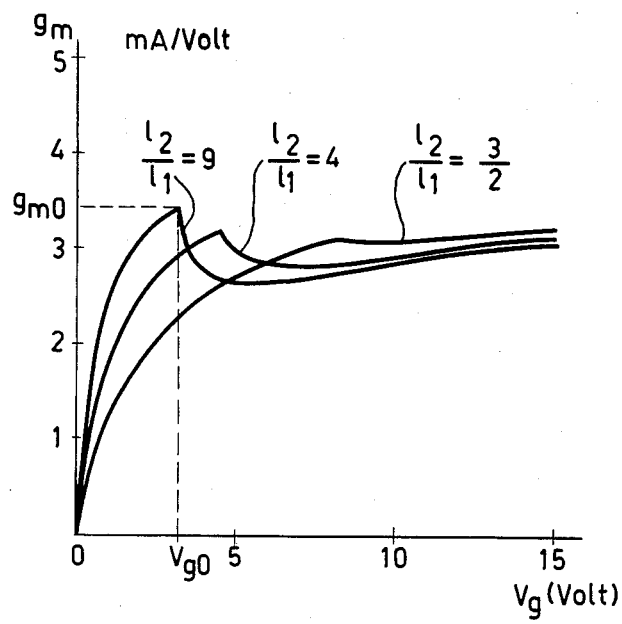
FIG. 2 shows the $g_m$-$V_g$ characteristics of the transistor shown in FIG. 1 for different values of $l_2/l_1$.

FIG. 2 shows the $g_m$-$V_g$ characteristics for a prior-art DMOS transistor, where $l_1 + l_2 = 5$ μm, for three different values of $l_2/l_1$. The distance d (see FIG. 1) between the source zone 5 and the drain zone 7 is the smallest distance determined photolithographically in the manufacture of the semiconductor structure of the DMOS transistor and is approximately equal to $l_1 + l_2$.

The characteristics shown in FIG. 2 apply (with a field effect transistor of otherwise the same dimensions)

for three different values of $l_2/l_1$, as is indicated in the Figure. For the curve for which $l_2/l_1=9$, therefore, $l_1=0.5$ μm and $l_2=4.5$ μm; for $l_2/l_1=4$ it applies that $l_1=1$ μm and $l_2=4$ μm, while for $l_2/l_1=1.5$ it applies that $l_1=2$ μm and $l_2=3$ μm. $V_g$ is the effective gate voltage, that is to say the gate electrode voltage minus the threshold voltage in volts; $g_m$ is expressed in mA per volt.

It has been found that in all cases the mutual conductance qualitatively exhibits the same behavior. With increasing $V_g$, $g_m$ increases to a maximum value $g_{mo}$ (different for each value of $l_2/l_1$) at $V_g=V_{go}$ (only indicated for the curve $l_2/l_1=9$). With a further increase in the gate voltage $V_g$, the mutual conductance again decreases after which, passing a minimum value, it gradually increases. It appears from FIG. 2 that with a decreasing ratio $l_2/l_1$ the difference between the maximum and and minimum values of $g_m$ becomes smaller so that from the gate voltage $V_{go}$ the linearity of the amplification of the transistor increases, but that also the maximum value of $g_m$ decreases and is reached only at a higher gate voltage $V_g$.

The described behavior can be explained by taking into consideration the fact that the DMOS transistor can be considered as two MOS transistors (one with the "short" channel and one with the "long" channel) connected in series, having different threshold voltages and the same signal on the gate electrode. For $V_g<V_{go}$, both transistors operate in the pentode range at a sufficiently high drain voltage and the mutual conductance of the DMOST as a whole is equal to that of the "short channel" MOST in itself. For $V_g>V_{go}$, however, the "short channel" MOST operates in the triode range and the mutual conductance of the whole DMOST is mainly determined by the "long channel" MOST. Above $V_{go}$, the characteristic therefore passes from the "short channel" MOST having a channel length $l_1$ to the "entire" MOST having a channel length $l_1+l_2$.

Figure 3:
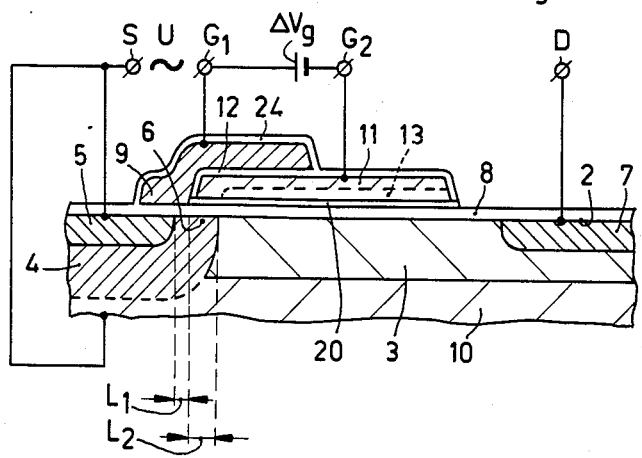
FIG. 3 shows diagrammatically in cross-section a part of a semiconductor device comprising a DMOST according to the invention.

In order to obtain good linearity and a comparatively high mutual conductance $g_m$ with a comparatively low gate voltage $V_g$, according to the invention a transistor structure having, for example, a construction as shown in FIG. 3 is used. A second gate electrode 11 located on the side of the drain zone 7 and separated from the first gate electrode 9 is present on the insulating layer 8 above the channel zone 6 beside the first gate electrode 9 located on the side of the source zone 5, whereby, in the direction from the source zone 5 to the drain zone 7, the length ($L_2$) of the part of the second gate electrode 11 located above the channel zone 6 is at least equal to that ($L_1$) of the part of the first gate electrode 9 located above the channel zone 6.

FIG. 3 shows only a part of the DMOS transistor, which is otherwise constructed in substantially the same manner as in FIG. 1.

With the DMOS transistor according to the invention, a $g_m$-$V_g$ characteristic can be obtained which, in analogy with the characteristics of FIG. 2, has a peak value, but in which the part of the curve in which $g_m$ is substantially constant is reached at a lower value of $V_g$, while further the $g_m$ value attained is higher. This is due to the fact that upon application of suitable bias voltages to the gate electrodes, both the "short" channel part $L_1$ and the "long" channel part $L_2$ are situated within the channel region 4 so that the overall channel length $L_1+L_2$ is considerably smaller, which leads to higher $g_m$ values and to a more rapid increase of $g_m$ with $V_g$. Since in the device according to the invention the gate electrodes 9 and 11 are mutually separated, different direct voltages $\overline{V}_g$ can be applied to the two gate electrodes. Due to these direct bias voltages, the charges in the channel parts $L_1$ and $L_2$ can be influenced independently. By the application of a suitable direct bias voltage to the gate electrode 11, the formation of a current channel controlled by the input signal in the drift region 3 can be avoided, while, by varying the difference $\Delta V_g$ between the gate direct voltages, the characteristic can be varied within given limits.

Figure 4:
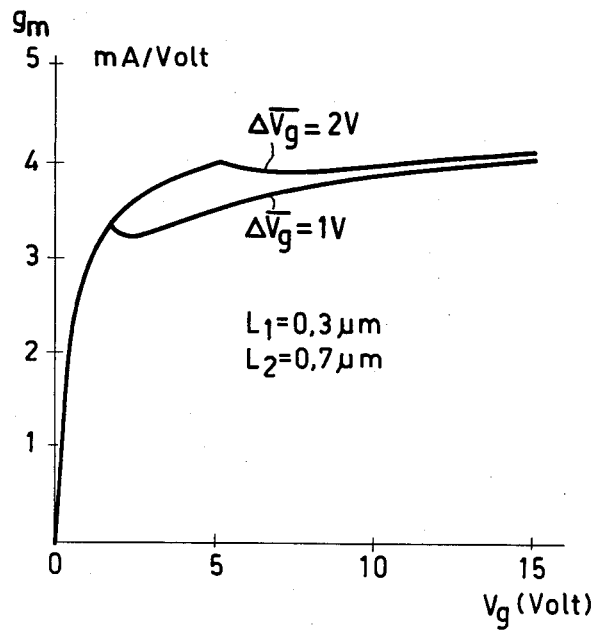
FIG. 4 shows the $g_m$-$V_g$ characteristics of the device shown in FIG. 3 for two different values of the direct voltage difference $\Delta \overline{V_g}$ between the gate electrodes.
Figure 5:
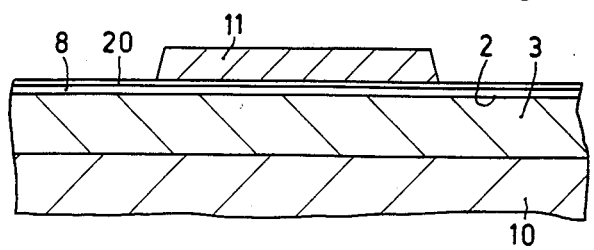
FIG. 5 to 9 illustrate the manufacture of the semiconductor device shown in FIG. 3 at successive stages of manufacture.

In FIG. 4, for a DMOS transistor according to the invention, the $g_m$-$V_g$ characteristics are plotted (for an arbitrary example, in which $L_1=0.3$ μm and $L_2=0.7$ μm) for a difference $\Delta V_g$ of 1 V and 2 V, respectively, between the direct bias voltages of the first and the second gate electrode. The same units are used on the axes as in FIG. 2. The signal U is applied to the first gate electrode 9 and is coupled capacitively to the second gate electrode 11 via the thin insulating layer 12, see FIG. 3.

Although the object of the invention (good linearity combined with a high $g_m$ value) can be attained by constructing the two gate electrodes as metal electrodes and by adjusting the desired characteristic by means of the direct bias voltages at the gate electrodes, the gate electrodes preferably are of polycrystalline silicon. In this case, it is advantageous when the first gate electrode 9 is highly doped, whereas the second gate electrode has such a low doping concentration that in the operating condition it is depleted at least in part above the drift region 3 and is not depleted above the channel region 4. Thus, in the embodiment of FIG. 3, in which both gate electrodes are made of polycrystalline silicon, the second gate electrode 11 has such a low doping that, when the (direct) voltage applied to this gate electrode is lower than the potential of the drift region 3, the gate electrode 11 is depleted at least in part above the drift region 3. However, no depletion occurs above the channel region 4 and in the more highly doped first gate electrode 9. As a result, due to the presence of the depletion region 13 (not shaded) in the gate electrode 11 the conduction in the drift region 3 is not or substantially not influenced by the input signal, while the channel conduction in the whole channel region 4 is controlled by the input signal, which is desirable for obtaining the appropriate characteristic.

The DMOS transistor shown in FIG. 3 can be manufactured as will be described below with reference to FIGS. 5 to 9.

The starting member is (see FIG. 5) a substrate 10, in this case a p-type conducting silicon substrate having a resistivity of, for example, 15 Ω.cm. An n-type layer 3 having a thickness of, for example, 0.5 μm and a doping of $3.10^{16}$ atoms per $cm^3$ is formed therein by implantation of arsenic ions. Instead, it is possible to use a p-type substrate with an n-type conducting epitaxial layer grown on it. Subsequently, a thermal oxide layer 8 is formed on the surface 2 and a silicon nitride layer 20 is formed on this layer in a known manner. This layer may also be an anti-oxidation layer of a different composition, for example, a layer of silicon oxynitride. On the nitride layer 20 is deposited a polycrystalline silicon layer 11 having a thickness of about 0.6 μm and an effective p-type doping of $10^{16}$ atoms per $cm^3$, which is shaped into the form of the second gate electrode by means of known photolithographic etching techniques. The term "effective" doping is to be understood to mean the doping ultimately present in the finished device after all processing steps have been carried out.

Subsequently, (see FIG. 6) the gate electrode 11 is thermally oxidized, a silicon oxide layer 21 having a thickness of about 0.4 μm being formed. A photolacquer mask 22 is provided on the side on which the drain electrode is to be formed, after which boron ions (23) are implanted into the silicon via the uncovered parts of the nitride layer 20 through the oxide 8. Thus, an implanted p-type layer 4 is formed.

Figure 7:
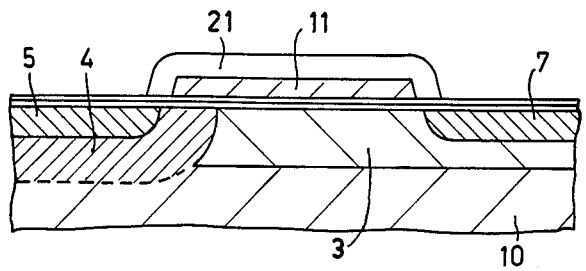

After the photolacquer mask 22 has been removed, the layer 4 is diffused further into the silicon by heating, as far as under the silicon layer 11 and into the substrate 10, after which the source zone 5 and the drain zone 7 are formed by implantation of arsenic ions; see FIG. 7. The oxidated layer (11, 21) then serves as an implantation mask.

Figure 8:
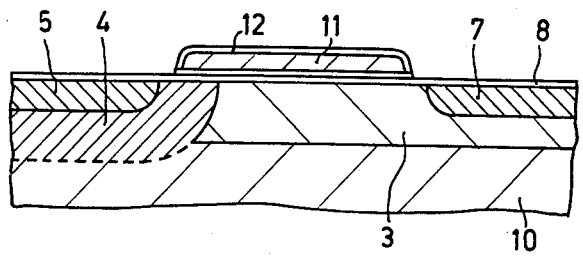

Subsequently, the oxide layer 21 is etched away and a fresh oxide layer 12 having a thickness of, for example, about 30 mm is thermally grown. The nitride layer 20 is then selectively removed, for example, in hot phosphoric acid, so that the structure of FIG. 8 is obtained. The product of the doping concentration and the ultimate thickness of the gate electrode 11 is about $0.6 \cdot 10^{12}$ atoms per $cm^2$.

Figure 9:
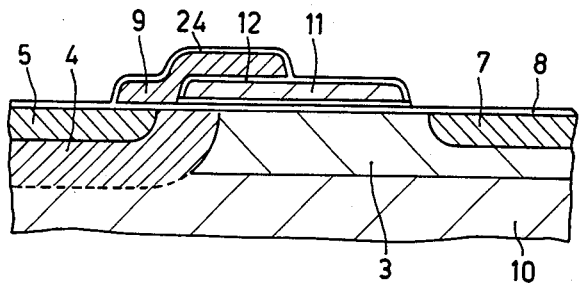

A fresh highly doped p-type conducting layer 9 of polycrystalline silicon is now formed, and the first gate electrode is obtained therefrom by photolithographic etching, said first electrode overlapping partly the oxidized second gate electrode 11. The gate electrode 9 is then lightly oxidized in order to form the oxide layer 24, after which the structure of FIG. 9 is obtained.

Subsequently, not shown further in the Figures) the required contact windows are etched into the oxide layers 8, 12 and 24 and the source, drain and gate electrodes are formed.

Figure 6:
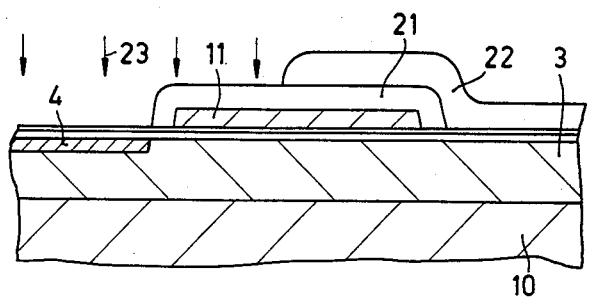

A method has been described above, by means of which the semiconductor device according to the invention can be manufactured with the use of a minimum number of masking and alignment steps. Of the critical dimensions, only the distance between the source zone 5 and the drain zone 7 is mainly defined by a photolithographic process (i.e. for forming the layer 11: in FIG. 5). None of the following processing steps requires an accurate masking and alignment step. The "short" channel length $L_1$ is determined by the oxidation step for obtaining the oxide layer 21 (FIG. 6).

Many variations of this method are possible. For instance, the first gate electrode 9, instead of being made of highly doped p-type silicon, may alternatively consist of highly doped n-type silicon or of metal or a metal silicide. Further, in FIG. 3, all conductivity types may be replaced by the opposite types.

Figure 10:
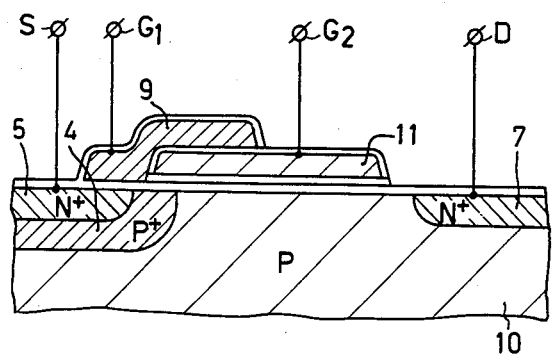
FIG. 10 shows a modification of the device shown in FIG. 3.
Figure 11:
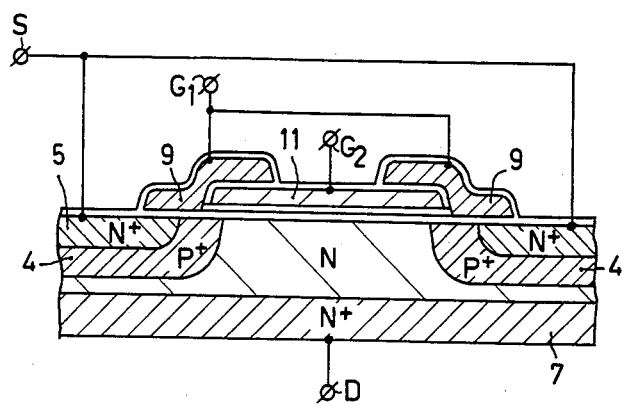
FIG. 11 shows another modification of the semiconductor device shown in FIG. 3.

Depending upon the use in the circuit, the second gate electrode 11 may be weakly n-doped instead of weakly p-doped. Moreover, the invention may be used with the same advantage in other DMOST structures. Examples of such other structures are shown in FIGS. 10 and 11. FIG. 10 shows a lateral DMOST according to the invention having a p-type drift region, while FIG. 11 shows an example of a vertical DMOST according to the invention. In all cases, the second gate electrode 11 can be depleted at least in part above the drift region 3 by applying a suitable direct voltage to this gate electrode, while the difference in threshold voltage between the "short channel" MOST and the "long channel" MOST which is desired for attaining the required $g_m$-$V_g$ characteristic can be adjusted.

The invention is not limited to the materials and dopings mentioned in the embodiments. For example, instead of silicon, the semiconductor materials (inclusive of the gate electrodes) may comprise other elementary semiconductors or semiconductor compounds, for example, Ge or GaAs etc., while also the doping concentrations may be varied.

What is claimed is:

1. A semiconductor device having a semiconductor body comprising at least an insulated gate field effect transistor having a surface-adjacent first region, a surface-adjacent channel region of a first conductivity type surrounded at least laterally by the first region, said first region being of a selected conductivity type, a source zone of the second opposite conductivity type adjoining the surface and surrounded within the semiconductor body at least in part by the channel region, a surface-adjacent channel zone between the source zone and the first region and forming part of the channel region, a drain zone of the second conductivity type which is separated by a part of the first region, referred to as the drift region, from the channel region and has a higher doping concentration than that of the first region, an electrically insulating layer located at least on the channel zone and a gate electrode located on the insulating layer above the channel zone, characterized in that a second gate electrode located on the drain side of the channel zone and separated from the first gate electrode is present on the insulating layer above the channel zone adjacent the first gate electrode located on the source side of the channel zone, whereby in the direction from the source zone to the drain zone, the length $L_2$ of the part of the second gate electrode located above the channel zone and separated therefrom only by said insulating layer is larger than the length $L_1$ of the part of the first gate electrode located above the channel zone and separated therefrom only by said insulating layer, said device further comprising means for applying a potential difference between said first and second gate electrodes during operation.

2. A semiconductor device as claimed in claim 1, characterized in that the gate electrodes comprise silicon.

3. A semiconductor device as claimed in claim 2, characterized in that the first gate electrode is highly doped and in that the second gate electrode comprises doping means for providing a sufficiently lower doping concentration such that in the operating condition it is depleted at least in part above the drift region and is not depleted above the channel region.

4. A semiconductor device as claimed in claim 3, characterized in that the product of the doping concentration in atoms per $cm^3$ and the thickness in cm of the second gate electrode lies between about $0.5 \cdot 10^{12}$ and $1.5 \cdot 10^{12}$ atoms per $cm^2$.

5. A semiconductor device as claimed in claim 1, 2, 3 or 4, characterized in that the length $L_2$ is at most equal to four times the length $L_1$.

6. A semiconductor device as claimed in claim 1, 2, 3 or 4, characterized in that the length $L_2$ is at most equal to 1.5 times the length $L_1$.

7. A semiconductor device as claimed in claim 1, 2, 3 or 4, characterized in that the first gate electrode partly overlaps the second gate electrode and is separated therefrom by a thin insulating layer.

8. A semiconductor device as claimed in claim 7, characterized in that the thin insulating layer is a thermal oxide layer on the second gate electrode.

* * * * *